United States Patent
Wyckoff et al.

(10) Patent No.: US 6,233,857 B1
(45) Date of Patent: May 22, 2001

(54) PORCELAIN COATED SUBSTRATE AND PROCESS FOR MAKING SAME

(75) Inventors: James L. Wyckoff, Nanuet, NY (US); John Hampton, Irving, TX (US)

(73) Assignee: Photo-Cut Graphics, Inc., Paramus, NJ (US)

( * ) Notice: Subject to any disclaimer, the term of this patent is extended or adjusted under 35 U.S.C. 154(b) by 0 days.

(21) Appl. No.: 09/162,554

(22) Filed: Sep. 29, 1998

Related U.S. Application Data

(62) Division of application No. 08/761,702, filed on Dec. 6, 1996, now Pat. No. 5,920,977.
(60) Provisional application No. 60/008,324, filed on Dec. 7, 1995.

(51) Int. Cl.[7] .................................................. G09F 13/00
(52) U.S. Cl. ............................................. 40/596; 428/195
(58) Field of Search .............................. 40/596; 428/195

(56) References Cited

U.S. PATENT DOCUMENTS

| | | |
|---|---|---|
| 1,559,572 | 11/1925 | Kapner . |
| 2,353,019 | 7/1944 | Dyer . |
| 2,581,310 | 1/1952 | Sweo . |
| 2,963,805 | 12/1960 | Sterry . |
| 3,726,707 | 4/1973 | Prosser et al. . |
| 3,852,145 | 12/1974 | Kloweit . |
| 3,961,112 | 6/1976 | Genevitz et al. . |
| 4,074,010 | 2/1978 | Knight . |
| 4,075,049 | 2/1978 | Wood . |
| 4,084,032 | 4/1978 | Pasersky . |
| 4,117,616 | 10/1978 | Denton . |
| 4,225,908 | 9/1980 | Small, Jr. . |
| 4,267,224 | 5/1981 | Kanzelberger . |
| 4,429,478 | 2/1984 | Sanders . |
| 4,440,590 | 4/1984 | Collins et al. . |
| 4,451,307 | 5/1984 | Zimmer . |
| 4,844,391 | 7/1989 | Follis . |
| 5,084,309 | 1/1992 | Smith et al. . |
| 5,091,224 | 2/1992 | Kushida . |
| 5,098,813 | 3/1992 | Nakano . |
| 5,162,160 | 11/1992 | Matsui et al. . |
| 5,196,395 | 3/1993 | James et al. . |
| 5,240,539 * | 8/1993 | Gunzelman et al. ................. 156/248 |
| 5,246,757 * | 9/1993 | Condon et al. ......................... 40/596 |
| 5,336,458 | 8/1994 | Hutchinson et al. . |
| 5,389,413 | 2/1995 | Condon et al. . |
| 5,438,781 * | 8/1995 | Landmann .............................. 40/584 |
| 5,534,347 | 7/1996 | Chen et al. . |
| 5,536,545 | 7/1996 | Condon et al. . |
| 5,589,021 * | 12/1996 | Bloom .................................... 40/616 |
| 5,686,170 * | 11/1997 | Condon et al. ....................... 428/195 |
| 5,779,919 * | 7/1998 | DiPietro et al. ....................... 40/615 |

\* cited by examiner

*Primary Examiner*—Archene Turner
(74) *Attorney, Agent, or Firm*—Weingram & Associates, P.C.

(57) ABSTRACT

The present invention provides for a sign consisting of an alloy substrate encapsulated in a porcelain coating which can be selectively applied to different areas of the substrate. The coating provides a smooth transitional region on graphic indicia of the sign to make the sign impervious to vandalism, fire and dirt. There is also provided a process of selectively applying a second coat of porcelain to the existing coating to only those elevated portions elevated or Braille portions of the substrate.

13 Claims, 3 Drawing Sheets

PORCELAIN COATED SUBSTRATE AND PROCESS FOR MAKING SAME

CROSS REFERENCE TO RELATED APPLICATIONS

This application is a divisional of application Ser. No. 08/761,702 filed on Dec. 6, 1996, now U.S. Pat. No. 5,920,977.

This application claims the benefit of U.S. Provisional Application No. 60/008,324 filed Dec. 7, 1995.

BACKGROUND OF THE INVENTION

1. Field of the Invention

The present invention relates to signs with surface relief, and in particular to signs encapsulated in a fired porcelainized enamel coating which is weather and vandal resistant.

2. Description of the Related Art

Substrates, signs and methods of producing the same are disclosed in the following patents:

| U.S. Pat. No. | Inventor(s) |
|---|---|
| 2,353,019 | Dyer |
| 2,581,310 | Sweo |
| 3,726,707 | Prosser, et al. |
| 3,961,112 | Genevitz, et al. |
| 4,074,010 | Knight |
| 4,075,049 | Wood |
| 4,084,032 | Pasersky |
| 4,225,908 | Small, Jr. |
| 5,084,309 | Smith, et al. |
| 5,091,224 | Kushida, et al. |
| 5,098,813 | Nakano, et al. |
| 5,162,160 | Matsui, et al. |
| 5,196,395 | James, et al. |
| 5,389,413 | Condon, et al. |
| 5,534,347 | Chen, et al. |

U.S. Pat. No. 2,353,019 to Dyer, discloses a method of etching steel, wherein steel sheets are dipped in ferric sulfate etching bath so that the sheet is prepared for a coating such as electroplating, enameling or other ornamental surfacing, such as tin or terne coatings.

U.S. Pat. No. 2,581,310 to Sweo, discloses a porcelain enamel article and method of producing same, wherein a surface of a steel work piece is cleaned and roughened to provide deep sharp edged pits therein, pickling in nitric acid after which a cover coat of porcelain enamel is applied to the roughened surface.

U.S. Pat. No. 3,726,707 to Prosser, et al., discloses porcelain enameling of steel, wherein nickel, cobalt and cooper are electrolessly deposited on steel after which enameling frit is coated to the steel.

U.S. Pat. No. 3,961,112 to Genevitz, et al., discloses luminous embossable tape which consists of a strippable two piece backing layer, a layer of adhesive adjacent thereto and a luminous layer which may be mixed and combined with the adhesive layer.

U.S. Pat. No. 4,074,010 to Knight, discloses ceramic-paint coatings wherein a material in finely divided form is applied as a first coat of ceramic paint, the coating is cured without fusing the ceramic paint, and then a second coat of ceramic paint is applied after which curing is done without paint. Curing is done at 750° F. or lower and therefore, the paint is not a fused coating.

U.S. Pat. No. 4,075,049 to Wood, discloses a method of preparing retroreflective sheeting wherein a monolayer of glass spheres is disposed to provide pathways therebetween for flow of a resinous material in the pathways to link a film over the spheres with a film beneath the spheres to which the spheres are adhered and partially imbedded.

U.S. Pat. No. 4,084,032 to Pasersky, discloses a process for making hot stamping foil for producing textured surface effects consisting of a carrier sheet, a releasing lacquer coat applied to the carrier sheet, an opaque color coat applied to said releasing lacquer coat and a heat/pressure activatable resinous adhesive coat applied to said opaque color coat.

U.S. Pat. No. 4,225,908 to Small, Jr., discloses a lighting fixture and glass enclosure having high angle anti-reflective film, wherein the anti-reflective film is produced by a chemical etch/leach process which is porous and skeletonized, and has a high silica content.

U.S. Pat. No. 5,084,309 to Smith, et al. discloses a product presenting different artistic images in the presence and absence of ambient light and a fabrication method therefor, wherein a primary image is produced as a plurality of first image forming elements on a substrate, after which a substantially clear phosphorescent material overlays the primary image to create a secondary image as a plurality of second image forming elements. The primary image is visible in ambient light and the secondary image is visible in the absence of ambient light.

U.S. Pat. No. 5,091,224 to Kushida, et al. discloses a method of preparation of a surface-coated, metal-made ornamental article consisting of coating a metalica substrate with a glassy protecting coating to prevent blooming or whitening on the surface.

U.S. Pat. No. 5,098,813 to Nakano, et al., discloses a stimulable-phosphor radiation image storage panel using specified heat or heat and activator-containing gas treatment.

U.S. Pat. No. 5,162,160 to Matsui, et al., discloses a fluorescent screen consisting of a substrate formed of a fibrous light-scattering material and a filling mixture of an organic fluorescent substance, and a binder evenly disbursed within said fibrous light-scattering material.

U.S. Pat. No. 5,196,395 to James, et al., discloses a method for producing crystallographic boundary junctions in oxide superconducting thin films, wherein V-shaped grooves are etched on a face of a crystal substrate by anisotropic etchant.

U.S. Pat. No. 5,389,413 to Condon, et al., discloses three dimensional signage and a method of making same, consisting of a thermoplastic laminate, preferably transparent, with a sign face layer of thermoplastics, a visual character adhered to the layer, a background color layer adhered to the layer, and a 3-D character in registration with and adhered to the background color layer.

U.S. Pat. No. 5,534,347 to Chen et al., discloses a fusing roll have a fluorocarbon-silicone barrier layer consisting of a cylindrical core coated with a layer of silicone elastomer upon which is coated a composition cured by heating the mixture for such to be cured.

Among the patents discussed above, there is no disclosure of signage consisting of a substrate having surface relief, such as relief lettering and/or Braille characters integrally formed from the substrate, and being encapsulated in fixed porcelain enamel another porcelain is selectively deposited to the relief lettering and/or Braille characters to provide a visual contrast between areas of relief and the underlying substrate, wherein the specifications of height, width, slope, spacing, and necessary ratios between such parameters comply with the Americans with Disabilities Act (of 1991 and 1992) as amended (hereinafter ADA).

It should be noted that among the visually impaired, approximately ten percent (10%) of such persons are able to read and understand Braille, while the remaining 90% rely on what is commonly referred to as "letter tracing". This is the impetus to produce signage with both relief lettering and Braille characters. Signage using this surface relief must comply with the ADA requirements which state in part ". . . letters and numbers shall have a width to height ratio between 3:5 and 1:1 and a stroke-to-height ratio between 1:5 and 1:10. Character height, as sized according to the viewing distance . . . 0.032" raised lettering not less than 5/8" height, no higher than 2"; and symbols in their own 6" high field and accompanied with Grade II Braille. Braille dot diameter 0.059", inter-dot spacing 0.090", horizontal separation between cells 0.241", vertical separation between cells 0.395". Characters and background of sign shall be an eggshell or matte (non-glare) finish. Characters shall meet a minimum 70% contrast to background."

The ADA specifically requires that with respect to signage, the alpha numerical text and symbols printed on the signs must be formed thereon to comply with certain size and viewing distance requirements. In particular, the text and characters must be in relief, i.e. projecting from the surface of the sign, in order to comply with the ADA. This construction and arrangement enables those with limited eyesight to discern or finger trace the sign and the messages conveyed, as well as enable the blind to read Braille characters of the sign.

It would therefore be advantageous to have a process of producing a sign with surface relief which complies with the ADA specifications and is protected from the weather, harmful chemicals and vandalism.

In addition, such a process should provide a sign which is easy to clean and maintain.

OBJECTS AND SUMMARY OF THE INVENTION

It is an object of the present invention to provide a process of making a sign so that an exterior surface of the sign is resistant to wear, alteration and/or destruction.

It is another object of the present invention to provide a process for producing relief indicia and symbols on a sign, wherein the indicia is in different grades of relief at different areas on an exterior surface of the sign.

It is another object of the present invention to provide a sign which is easy to clean, inexpensive to maintain, and which protects the exterior surface and structural integrity of the sign.

It is another object of the present invention to provide a process for treating an exterior surface of the sign to be of a reflective quality ranging from matte to glossy (specular).

It is another object of the present invention to provide a sign which has non-glare porcelainized metal based relief indicia thereon, as well as on the background.

It is another object of the present invention to utilize recyclable manufacturing materials for the sign.

It is another object of the present invention to provide a process wherein the exterior surface of the sign is uniformly treated so that the exterior surface of the relief indicia share a common exterior surface.

It is another object of the present invention to provide an exterior surface of a sign to display letters, numerals, symbols, designs, words and/or Braille characters (dots), including Grade I and/or II Braille translation, in relief.

It is another object of the present invention to provide Braille characters and relief lettering over the surface of the sign to meet the requirements and specifications by the ADA.

It is another object of the present invention to provide relief portions of the sign with an ability to glow in reduced light conditions, by an infusion of phosphorescent pigments that are contained in a porcelain coating of the invention, wherein the sign that has been charged with sunlight or fluorescent light will glow and be readable for up to approximately eight hours.

It is another object of the present invention to provide a process for encapsulating an alloy substrate of the sign, which process deposits the coating on the substrate to a particular thickness at select areas of the substrate.

It is another object of the present invention to provide a method of selectively coating relief portions of the sign such that elevated portions are easily distinguishable from the underlying surface area of the sign.

It is another object of the present invention to provide a process for encapsulating an alloy substrate for a sign with a porcelain coating have phosphorescent pigments to glow during reduced ambient light conditions.

It is another object of the present invention to provide a sign which includes gently sloping transition regions on at least the porcelain coating at an area where the raised letters, symbols or Braille characters extend from the surface of the substrate.

It is still another object of the present invention to provide a protective coating for signage, which protective coating substantially reduces if not eliminates sharp, angular regions on the sign surface which might otherwise trap debris to foul the Braille characters and cause pitting of the sign.

BRIEF DESCRIPTION OF THE DRAWINGS

For a more complete understanding of the present invention, reference may be had to the detailed description of the preferred embodiments taken in conjunction with the accompanying drawings, of which.

DETAILED DESCRIPTION OF THE PREFERRED EMBODIMENTS

The disclosure of the parent application, Ser. No. 08/761,702, filed Dec. 6, 1996, is hereby incorporated by reference now U.S. Pat. No. 5,920,977.

Figure 1:
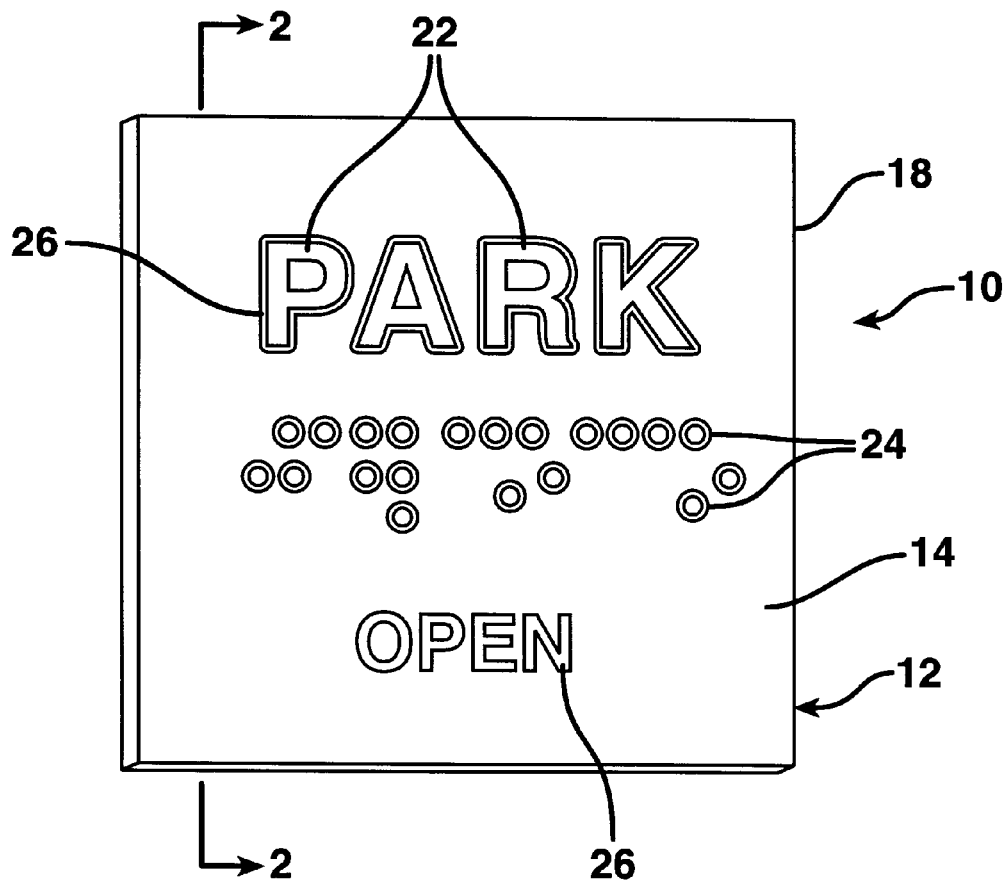
FIG. 1 is a top plan view of a sign treated according to the present invention.
Figure 2:
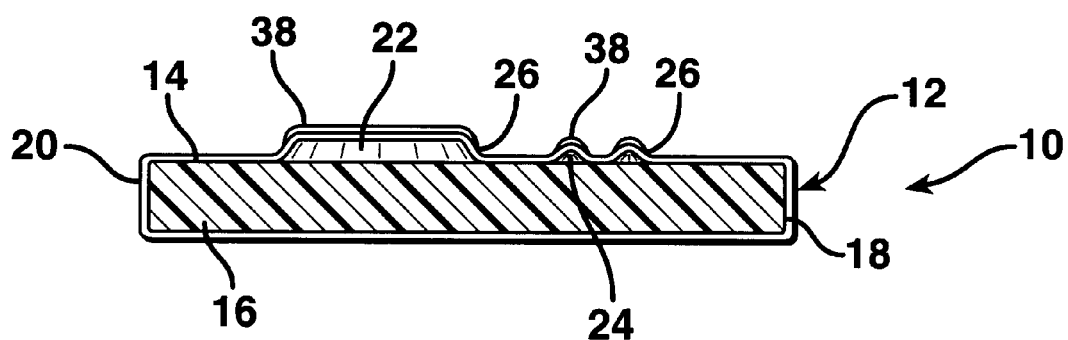
FIG. 2 is a cross-sectional view of the sign of the present invention taken through line 2—2 in FIG. 1.

Referring to FIGS. 1 and 2, the present invention is a sign 10 consisting of an extremely durable substrate 12, in sheet or plate form, so that the sign obtains the advantages and fulfills the objects described above. To that end, the substrate 12 of the present invention is composed of an approved low-carbon steel, brass, bronze, copper, aluminum, cold rolled steel, other compatible alloys or combinations thereof. The substrate 12 includes an upper surface 14, a lower surface 16 and a sidewall 18 interconnecting the upper surface 14 and the lower surface 16. The upper surface 14, lower surface 16 and sidewall 18 are referred to herein collectively as "the exterior surface" of the substrate 12. The material of the substrate 12 is capable of retaining a protective coating, such as a non-metallic inorganic fused coating 20 of fired porcelainized enamel with the substrate, sheet, plate, or fabrication having a thickness ranging from approximately 0.005" to 24" thick/deep.

The matte or specular (glossy) porcelain enamel coating 20 covers the exterior surface of the substrate 12 or envelopes the substrate as a substantially vitreous (or glossy), inorganic coating bonded to the metal substrate utilizing a fusion method above approximately 1,000 degrees fahrenheit (1,000° F.) and up to 1,650° F. The porcelain surface is uniformly deposited, finished and free of defects that might otherwise effect the serviceability of the sign, or detract from the general appearance of the product when viewed from a distance of five feet (5'), or the distance from which the product is viewed, whichever is greater. The total thickness of the porcelain coating is approximately 0.007 inches to approximately 0.020 inches on the exterior surface of the substrate 12 including the edges of the substrate, if such an application is necessary. In those instances where the specifications require more than one color to achieve graphic requirements these parameters can be adjusted.

The varying degrees of specular finish of the porcelain enamel coating can range from matte to full gloss, and covers the display surface and all sides, edges of the sign. The coating 20 envelopes the substrate 12 as a substantially vitreous (or glossy), inorganic coating bonded to the substrate utilizing fusion.

The process according to the present invention produces signage which has surface relief in the form of relief words, letters, numerals, symbols such as that shown at 22 and Braille characters (dots) such as that shown at 24. The process also provides for subsequent layering of fire porcelainized enamel in contrasting colors so that a word, symbol, etc., such as that shown at 26 is displayed on the porcelainized coating. In addition, the protective coating 20 of porcelain is disposed on the substrate such that a sloping transition surface 26 is provided in a region where the protective coating 20 covers the substrate where the protruding surface relief and/or Braille characters extend from the substrate 12.

Figure 3:
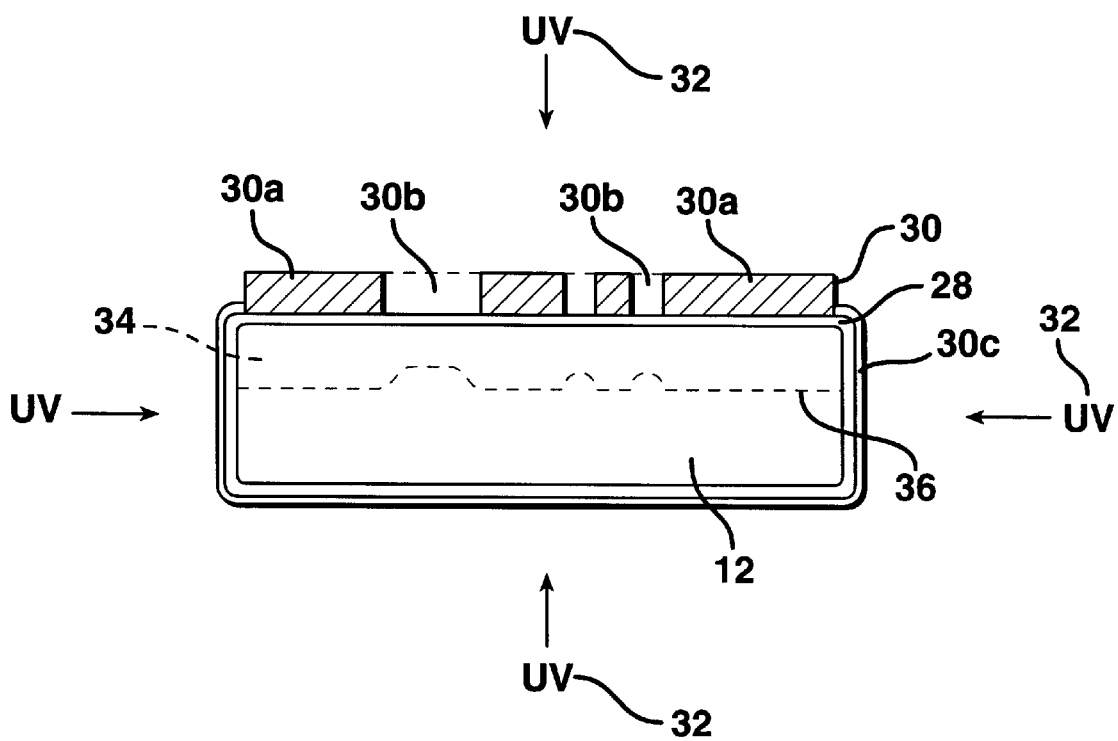
FIG. 3 is a partial cross-section side view of the substrate coated to provide surface relief thereon.

The process of the present invention to produce the substrate is discussed below with reference also to FIGS. 2–4.

Contrasting surface lettering coloring is selectively applied to the relief graphics by either one or a combination of the following methods:

Hand application using brayers.
Hand application using brushes and a flexible palette knife.
Machine application using rollers.
Silk screen method.
Photo-stencil method.
Hand-cut stencil.

Contrasting lettering and graphics are applied to the flat surfaces by either one or a combination of the following methods:

Photo-stenciling.
Hand-cut stenciling.
Silk screen method.

The coating of contrasting color on the surface of the relief letters and graphics is also porcelain enamel which is bonded to the first porcelain enamel coating utilizing a fusion method at temperatures to 1,650 degrees Fahrenheit (1,650° F.).

The first step is to provide a substrate of one of the alloys discussed above. The alloy is formed by cutting into a predetermined shape depending upon its application as signage in the environment to be used. The substrate is also edge-detailed, i.e. beveled, and corner detailed, i.e. radiused and scalloped. sanding, polishing and/or de-burring can also be performed on the substrate 12 if necessary.

The substrate is then encapsulated within a photo-sensitive resist 28. The resist 28 extends over the exterior surface of the substrate 12 and permitted to cure to maximize adhesion to the substrate.

Figure 4:
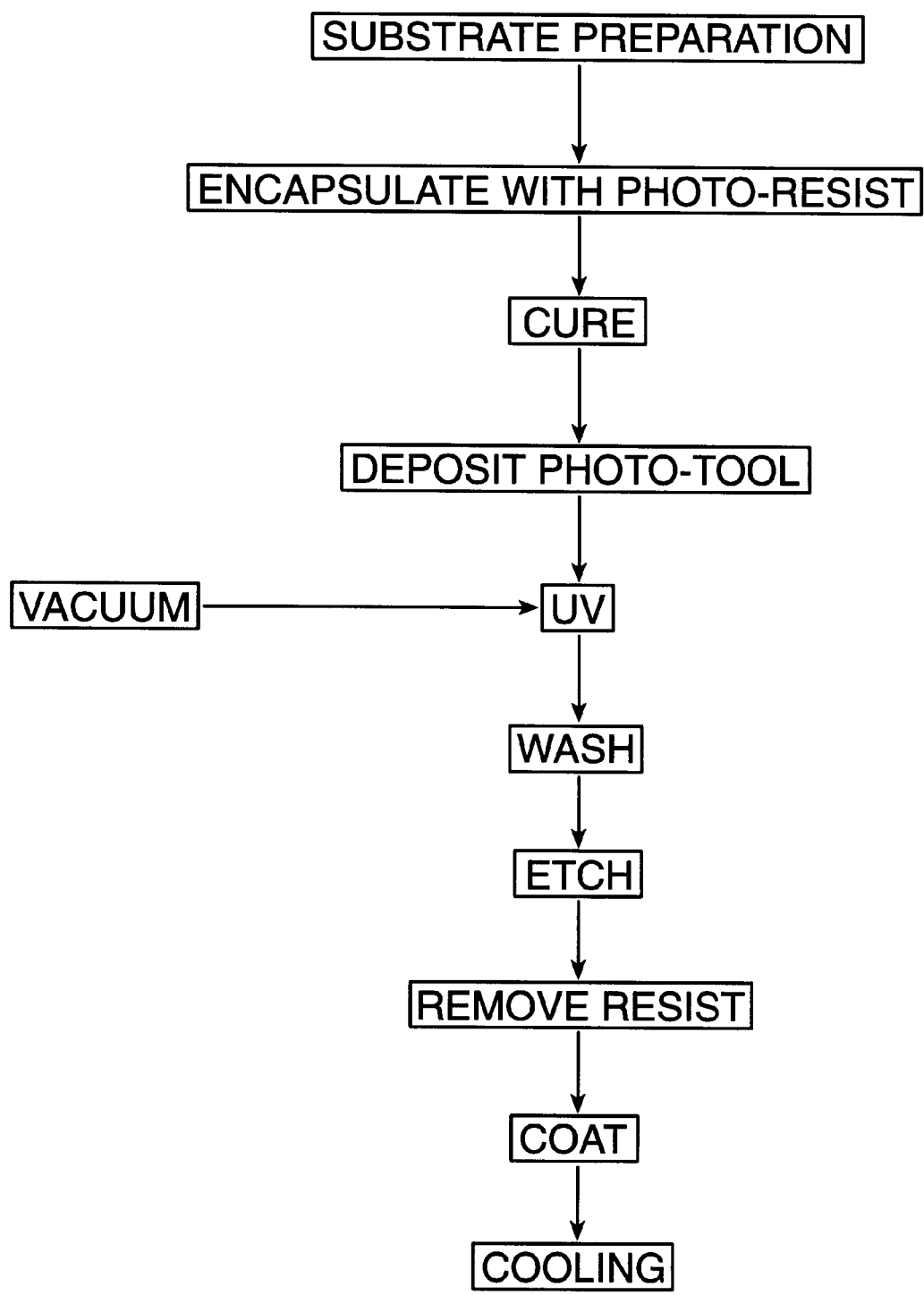
FIG. 4 is a flow chart showing the steps of the present invention.

A "photo-tool" 30 is disposed over the surface of the substrate 12 for which surface relief is to be effected, such as shown in FIG. 4. The photo-tool 30 is preferably an acetate sheet or template having a thickness of preferably 0.005", although other thicknesses can be employed. The acetate sheet 30 has regions of film positive (+) and film negative (−) formed therein as shown in FIG. 4. For example, the area designated 30a is a black or negative film which prevents ultraviolet (UV) light 32 from reaching the underlying resist 28. That is, the film negative portion 30a is opaque so that the layer of resist 28 on the substrate 12 immediately beneath the film negative portion is shielded from the UV rays.

The acetate sheet 30 is also provided with clear regions designated 30b which are substantially transparent to permit the UV rays from penetrating the acetate sheet 30 and impacting on the resist 28 immediately beneath the regions 30b. The regions 30b are referred to as the film positive regions and permit the UV rays to impact on the resist 28, such that the UV polymerizes the resist 28 to the surface of the substrate immediately beneath the resist 28.

Alternatively, the acetate sheet 30 can be disposed on the resist 28 in a vacuum so that a tight interface is established between the resist 28 and the acetate sheet 30. The vacuum will in effect cause the acetate sheet 30 to be "drawn down" onto the resist 28 so that there is no space therebetween in which UV light could inadvertently enter and polymerize an area where polymerization is not to occur.

The substrate 12 is then exposed to a photo-developer wash, for example, immersed in an agitated, heat and pH controlled photo developer wash to weaken and sluff-off the unpolymerized resist background. The portions of the resist 28 which will be sluffed off are those portions of the resist 28 immediately beneath the acetate sheet regions 30a and beneath the diaper or cloak 30c of the sheet 30. The polymerized resist is impervious to the photodeveloper acid wash. Therefore, after the substrate 12 has been washed, the resist remains polymerized to those portions immediately beneath the film positive regions 30b.

The substrate is then subjected to acid etching which employs controlled heat, agitation and pH controls to etch away background 34 of the substrate 12 that has not been polymerized so that surface relief is provided on the substrate.

Photo-Chemical or Electro-Chemical Acid Etching—Using a photographically sensitive resist which is applied to the metal substrate, the image is exposed and developed using a film positive or negative which contains the graphics to be reproduced, the resisted material is then put in an etching (acid) bath for etching away the metal to a controlled depth as required for the job. In the case of ADA (Americans with Disabilities Act) signage, the etch is to a depth of 0.03125". The panel is then cleaned, pre-treated, primed and porcelain enamelized to create a ceramic coating.

EDM—Electro-Discharge Machining—An electromechanical process of metal removal from selected areas. The areas not removed are controlled by computer generated compatible file formats that drive the CAD based machine to do its work. The metal is then sent through the porcelain process (see specs. attached).

Machine or Raster Engraving Method—If manual, by a milling machine, if computer controlled then using a CNC machine that mils, cuts or routes away the unwanted metal through a mechanical cutting process. The remaining bottom area are then smoothed out through a series of abrasives to remove the cutting or routing lines that are left behind.

Stamping/Embossing—This method utilizes a male and female die set that is used to raise the specific areas or letters and Braille that need to be raised. The die set is required for each different message or lettering that is needed. This method is geared toward higher volume repeats of the same image. The plates are then sent for the enameling process.

Next, any remaining resist on the substrate is stripped away. The resulting relief surface on the substrate 12 includes the tactile surface areas of relief lettering 22 and/or Braille characters 24 due to the surface relief being effected and represented by 36, which is also shown in FIG. 3.

The entire substrate 12 is then encapsulated in a protective coating 20 of porcelain. The porcelain coating 20 is fused to the substrate 12 at up to 1,650 degrees Fahrenheit (1,650° F.) depending upon the substrate alloy used and colors selected for the porcelain. This results in a substrate having surface relief with the relief text, Braille characters extending from the surface of the substrate. However, at this stage, there is not discernible difference between the colors of the relief text and Braille characters and the remaining surface area of the substrate.

The sloping, smooth, transition surface 26 eliminates right angles where the relief indicia extends from the top surface 14 of the substrate 12, so that debris or other matter does not become trapped on the surface of the substrate and impair the visibility or reflective, qualities of the substrate. In addition, because foreign matter does not easily adhere to the sign, there is less chance that blind persons using the Braille characters will misinterpret a character due to some inadvertently trapped material between the,Braille characters.

The smooth transition surface provides for easy cleaning of the surface of the sign and deflects objects which might otherwise become trapped on the sign. The smooth transition surface 26 also is more comfortable to finger trace.

Selected portions 38 of the coating 20 are then coated with a contrasting color so that the text is discernible to the general public and those that are visually impaired, but not blind. Of course, the Braille characters do not have to have any contrasting color but this can be done. The selective porcelainization of the relief characters is done at a fusing temperature up to 1,650 degrees (1,650° F.) which will fuse the second porcelain coating 38 with the first porcelain coating 20.

Finally, the substrate is permitted to cool so that the porcelain coatings can cure.

The result of the process of the present invention is that the relief between and among the indicia and Braille characters still meets the specifications of the ADA as pertains to height, width, slope, and spacing between characters.

In addition, as shown in FIG. 1, relief text 22 and the Braille characters 24 as dots do not extend from the underlying surface at 90° angles, which would result in sharp edges irritable to the touch and capable of snagging objects. Instead, there is a gentle transitional slope region 26 in the coating 20 where the lettering and the characters extend from the underlying surface to their selected height.

The deposition of the coatings 20,38 is substantially uniform so that the relief text and Braile characters extend to a similar height above the substrate. The graphics are reproduced in conformity with standards for Braille and Tactile lettering as specified by the ADA.

The face of the letters can have a matte, satin or spectral finish, as may the background as well.

Recessed background areas are colored with a 70% contrast to the letters, when conformity to ADA specifications is required; otherwise any color combinations of background or letters and symbols may be used.

The materials described above for the signage can be color matched to comply with the particular application and to conform with area aesthetics, the corners contoured, (i.e. radius, scallop, special shapes, etc.), and the edges treated, (i.e. bevel, quarter-round, custom details, etc.). The signage surface can display raised copy, Braille characters with raised or recessed symbols/indicia, or combination thereof.

The glassy finish on the substrate surface is practically impervious to attack, particularly the surface areas having Braille or other raised indicia. However the ADA requires that a glossy (or specular) exterior surface cannot be employed because it is indistinguishable and practically invisible to a person who, although not blind, is visually impaired, i.e. the glossy surface makes it extremely difficult, if not impossible, for a visually impaired individual to read the signage because of the high reflection and the reduced contrast between the raised surfaces and relief of the signage.

The sign of the present invention is extremely resistant to cutting, acid, fire, alkalines, etc.

It will be understood that the embodiments described herein are merely exemplary and that a person skilled in the art may make many variations and modifications without departing from the spirit and scope of the invention. All such variations and modifications are intended to be included in the scope of the invention as defined by the appended claims.

What is claimed is:

1. A sign, comprising:
    an alloy substrate comprising:
    a top surface,
    a bottom surface,
    a continuous sidewall connecting the top surface with the bottom surface;
    indicia integral with the alloy substrate and extending therefrom to an upper surface at a select distance from the top surface of the substrate; and
        a continuous protective coating extending to encapsulate the substrate, the indicia and the upper surface of the indicia, the protective coating forming a sloping transitional region at an area where the protective coating extends between the top surface of the alloy substrate and the upper surface of the indicia.

2. A sign comprising:
    an alloy substrate from which indicia are formed and extend therefrom to provide relief between the indicia and a surface of the alloy substrate,
    a continuous protective coating extending to encapsulate the alloy substrate, the indicia and the surface of the substrate,
    the continuous protective coating forming a transition surface which is sloped between the surface of the alloy substrate and an upper surface of the indicia.

3. The sign according to claim 2, wherein the protective coating is selected from the group consisting of fired porcelain enamel, and ceramic.

4. The sign according to claim 2, further comprising:
    a display coating disposed on the upper surface of the indicia for providing contrast between the surface of the substrate and the upper surface of the indicia.

5. The sign according to claim 2, wherein the alloy substrate is formed from material selected from the group consisting of low carbon steel, brass, bronze, copper, aluminum, cold rolled steel, other compatible alloys, and combinations thereof.

6. The sign according to claim 2, wherein the protective coating is disposed in a matte finish.

7. The sign according to claim 2, wherein the protective coating is disposed as a specular finish.

8. The sign according to claim 2, wherein the indicia is selected from the group consisting of relief lettering, numerals, words, symbols and Braille characters.

9. The sign according to claim 2, where the protective coating further comprises:
   phosphorescent pigments to provide luminescence in low light conditions.

10. The sign according to claim 4, wherein the display coating further comprises:
    phosphorescent pigments for providing luminescence in low light conditions.

11. The sigh according to claim 2, wherein the alloy substrate has a thickness of from approximately 0.005 inches to approximately 24 inches.

12. The sign according to claim 2, wherein the protective coating has a thickness of from approximately 0.007 inches to approximately 0.020 inches.

13. The sign according to claim 2, wherein the surface relief between the indicia and the surface of the alloy substrate is approximately 0.032 inches.

* * * * *